(12) United States Patent
Lee

(10) Patent No.: US 8,884,505 B2
(45) Date of Patent: Nov. 11, 2014

(54) LIGHT EMITTING DEVICE INCLUDING A PLURALITY OF LIGHT EMITTING CELLS AND LIGHT EMITTING DEVICE PACKAGE HAVING THE SAME

(75) Inventor: Sang Youl Lee, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 601 days.

(21) Appl. No.: 12/621,305

(22) Filed: Nov. 18, 2009

(65) Prior Publication Data

US 2010/0123145 A1    May 20, 2010

(30) Foreign Application Priority Data

Nov. 18, 2008  (KR) .................. 10-2008-0114613

(51) Int. Cl.
| | | |
|---|---|---|
| *H01L 33/00* | (2010.01) | |
| *H01L 27/15* | (2006.01) | |
| *H01L 33/20* | (2010.01) | |
| *H01L 33/50* | (2010.01) | |

(52) U.S. Cl.
CPC .............. *H01L 27/153* (2013.01); *H01L 33/20* (2013.01); *H01L 33/50* (2013.01)
USPC ......................................... 313/485; 257/103

(58) Field of Classification Search
CPC ..... H01L 27/153; H01L 33/20; H01L 33/504; H01L 21/0485
USPC ...................... 313/485; 257/98, 103, E33.068
See application file for complete search history.

(56) References Cited

U.S. PATENT DOCUMENTS

| | | | |
|---|---|---|---|
| 5,895,932 A * | 4/1999 | Bojarczuk et al. ............ | 257/103 |
| 5,952,681 A * | 9/1999 | Chen .............................. | 257/89 |
| 6,366,018 B1* | 4/2002 | Garbuzov et al. ............. | 313/542 |
| 6,395,564 B1 | 5/2002 | Huang | |
| 6,576,488 B2* | 6/2003 | Collins et al. .................. | 438/29 |
| 6,603,146 B1 | 8/2003 | Hata et al. | |
| 2003/0168663 A1* | 9/2003 | Slater et al. .................... | 257/77 |
| 2004/0222735 A1* | 11/2004 | Ragle ............................ | 313/501 |
| 2005/0184638 A1* | 8/2005 | Mueller et al. ................ | 313/485 |
| 2006/0097270 A1* | 5/2006 | Yuri ............................... | 257/88 |
| 2006/0284195 A1* | 12/2006 | Nagai ............................ | 257/98 |
| 2007/0228394 A1 | 10/2007 | Asano | |
| 2007/0252512 A1 | 11/2007 | Bertram et al. | |
| 2008/0027212 A1 | 1/2008 | Skinner | |
| 2008/0272712 A1 | 11/2008 | Jalink et al. | |
| 2008/0315217 A1 | 12/2008 | Van Der Wel | |

FOREIGN PATENT DOCUMENTS

| | | |
|---|---|---|
| CN | 101005110 A | 7/2007 |
| CN | 101300687 A | 11/2008 |
| EP | 0855751 A2 | 7/1998 |
| JP | 1998-261818 A | 9/1998 |

(Continued)

OTHER PUBLICATIONS

DOWLEX 2045 datasheet downloaded Sep. 16, 2011.*

(Continued)

*Primary Examiner* — Thomas L Dickey
(74) *Attorney, Agent, or Firm* — Saliwanchik, Lloyd & Eisenschenk

(57) ABSTRACT

A light emitting device comprises a first conductive semiconductor layer, a plurality of light emitting cells separated on the first conductive semiconductor layer, a phosphor layer on at least one of the light emitting cells, and a plurality of second electrodes electrically connected to the light emitting cells.

18 Claims, 4 Drawing Sheets

(56) References Cited

FOREIGN PATENT DOCUMENTS

| | | |
|---|---|---|
| JP | 2002-246654 A | 8/2002 |
| JP | 2006-041077 A | 2/2006 |
| JP | 2009-295870 A | 12/2009 |
| KR | 10-2008-0054402 A | 6/2008 |

OTHER PUBLICATIONS

Hostasol 8G datasheet downloaded Sep. 16, 2011.*

Office Action dated Jul. 29, 2011 in Korean Application No. 10-2008-0114613, filed Nov. 18, 2008.

Office Action dated Apr. 25, 2011 in Chinese Application No. 200910222161.4 filed Nov. 18, 2009.

Notice of Allowance dated Mar. 29, 2012 in Korean Application No. 10-2008-0114613, filed Nov. 18, 2008.

Office Action dated Sep. 4, 2013 in Chinese Application No. 200910222161.4.

* cited by examiner

LIGHT EMITTING DEVICE INCLUDING A PLURALITY OF LIGHT EMITTING CELLS AND LIGHT EMITTING DEVICE PACKAGE HAVING THE SAME

CROSS-REFERENCE TO RELATED APPLICATION

This application claims the benefit under 35 U.S.C. §119 and of Korean Patent Application No. 10-2008-0114613, filed Nov. 18, 2008, which is hereby incorporated by reference in its entirety.

BACKGROUND

The present disclosure relates to a light emitting device and a light emitting device package having the same.

Group III-V nitride semiconductors have been in the spotlight as a core material for light emitting devices, such as light emitting diodes (LEDs), laser diodes (LDs), and the like, because of their excellent physical and chemical properties. Group III-V nitride semiconductors are composed of a semiconductor material having the chemical formula of $In_xAl_yGa_{1-x-y}N$ (where $0 \leq x \leq 1$, $0 \leq y \leq 1$, $0 \leq x+y \leq 1$).

LEDs are a kind of semiconductor device that convert electricity into infrared rays or light by using the characteristics of a compound semiconductor to transmit and receive a signal, and they are used as light sources.

LEDs or LDs made of nitride semiconductor materials are widely adopted in light emitting devices for obtaining light, and are applied as light sources for various products, for example, a light emission part for a keypad of a mobile phone, an electrical sign board, and a lighting device.

BRIEF SUMMARY

Embodiments provide a light emitting device capable of full-color light emission in a single chip and a light emitting device having the same.

Embodiments provide a light emitting device comprising a plurality of light emitting cells separated on a first electrode contact layer, a phosphor layer on at least one of the light emitting cells, and a light emitting device having the same.

An embodiment provides a light emitting device comprising: a first conductive semiconductor layer; a plurality of light emitting cells separated on the first conductive semiconductor layer, wherein the light emitting cells each comprise an active layer and a second conductive semiconductor layer; a phosphor layer on at least one of the light emitting cells; and a plurality of second electrodes electrically connected to the light emitting cells.

An embodiment provides a light emitting device package comprising: a package body; a plurality of the electrodes on the package body; a light emitting device having a plurality of light emitting cells connected to the plurality of electrodes and a phosphor layer on at least one of the light emitting cells; and a resin material covering the light emitting device.

The details of one or more embodiments are set forth in the accompanying drawings and the description below. Other features will be apparent from the description and drawings, and from the claims.

DETAILED DESCRIPTION

Reference will now be made in detail to embodiments of the present disclosure, examples of which are illustrated in the accompanying drawings. In the description of embodiments, the 'on' or 'under' of each layer may be described with reference to the accompanying drawings, and the thickness of the each layer will also be described as an example and is not limited to the thickness of the accompanying drawings.

In description of embodiments, it will be understood that in a case where a layer (or film), a region, a pattern, or components is referred to as being 'on' or 'under' another substrate, layer (or film), region or patterns, the 'on' and 'under' include all the meanings of 'directly' and 'indirectly'.

Figure 1:
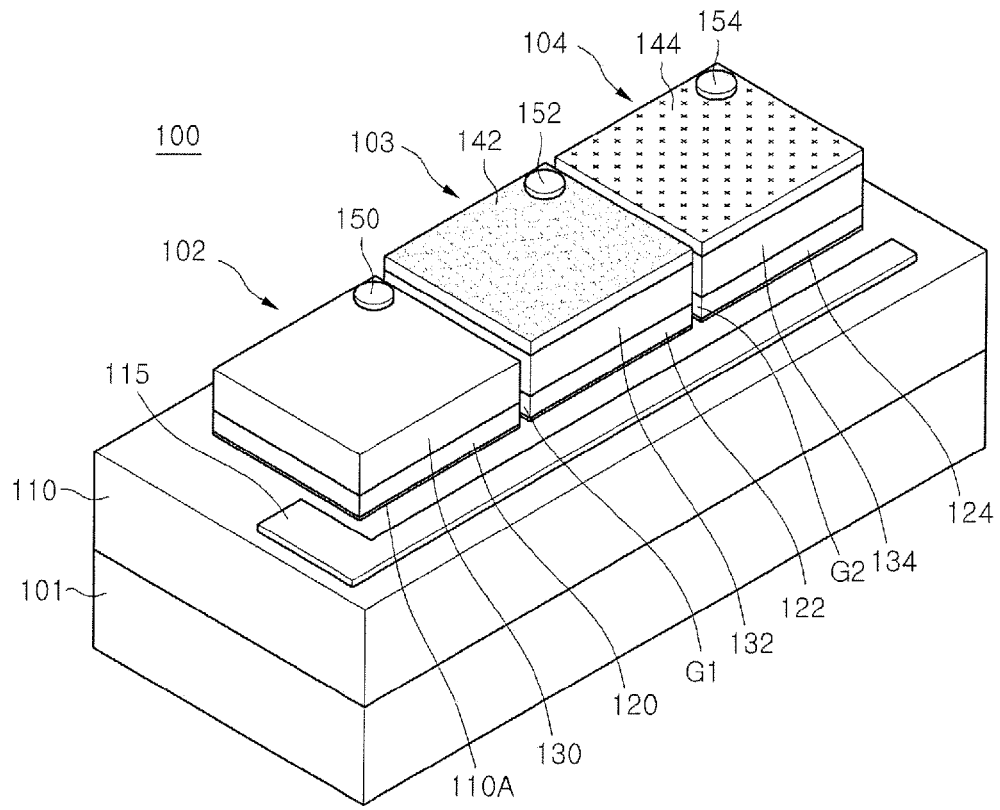
FIG. 1 is a perspective view illustrating a light emitting device according to a first embodiment.
Figure 2:
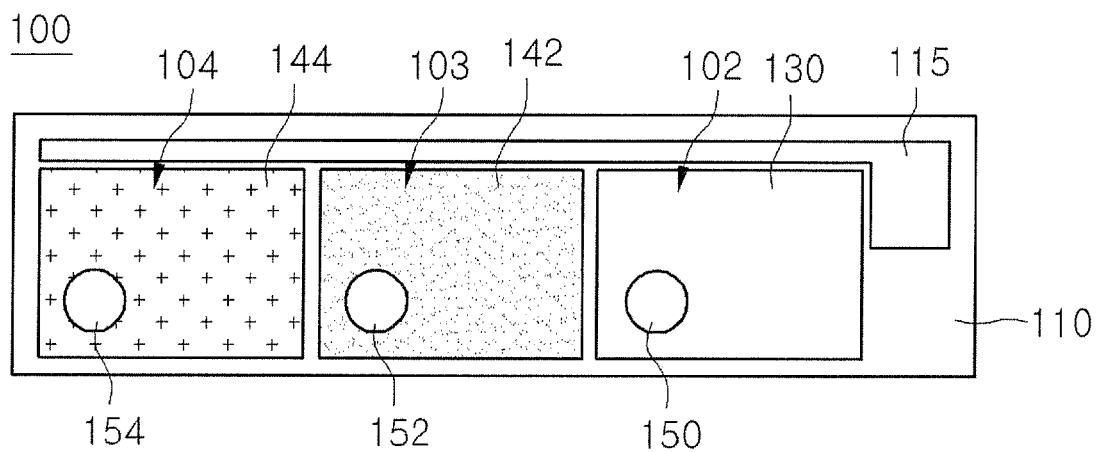
FIG. 2 is a plan view illustrating the light emitting device of FIG. 1.

FIG. 1 is a side sectional view illustrating a light emitting device according to a first embodiment.

Referring to FIG. 1, a light emitting device 100 includes a substrate 101, a first conductive semiconductor layer 110, a plurality of light emitting cells 102, 103 and 104, a first phosphor layer 142, a second phosphor layer 144, a first electrode 115, and a plurality of second electrodes 150, 152 and 154.

The substrate 101 may be selected from the group consisting of a sapphire substrate ($Al_2O_3$), gallium nitride (GaN), silicon carbide (SiC), zinc oxide (ZnO), silicon (Si), gallium phosphide (GaP), indium phosphide (InP), gallium oxide ($Ga_2O_3$), a conductive substrate, and gallium arsenide (GaAs). A concave-convex pattern is formed on the substrate 101, resulting in improvement of external quantum efficiency.

A compound semiconductor is grown on the substrate 101. A growth equipment may include, but is not limited to, an electron beam evaporator, a physical vapor deposition (PVD) apparatus, a chemical vapor deposition (CVD) apparatus, a plasma laser deposition (PLD) apparatus, a dual-type thermal evaporator, a sputtering apparatus, and a metal organic chemical vapor deposition (MOCVD) apparatus.

A layer or pattern using a compound semiconductor of group II to VI elements, for example, at least one of a ZnO layer (not shown), a buffer layer (not shown) and an undoped semiconductor layer (not shown), may be formed.

The buffer layer and the undoped semiconductor layer may be formed of a compound semiconductor of group III-V elements. The buffer layer may decrease a lattice constant difference from the substrate, and the undoped semiconductor layer may be formed of an undoped GaN-based semiconductor. The buffer layer and/or the undoped semiconductor layer may not be formed, but is not limited thereto.

A plurality of light emitting cells 102, 103 and 104 including a plurality of compound semiconductor layers are formed on the substrate 101. The light emitting cells 102, 103 and 104 each include upper portions 110A of first conductive semiconductor layer 110, active layers 120, 122 and 124, and second conductive semiconductor layers 130, 132 and 134.

The light emitting cells 102, 103 and 104 may be divided and grown as individual structures on the first conductive semiconductor layer 110, or may be grown up to the uppermost layer and divided by a mesa etching. The dividing method and the number of divided structures may be changed variously within the technical scope of embodiments.

The first to third light emitting cells 102, 103 and 104 may be spaced apart by predetermined gaps G1 and G2.

The first conductive semiconductor layer 110 may be formed on the substrate 101 or another semiconductor layer. The first conductive semiconductor layer 110 may be formed of a compound semiconductor of group III-V elements doped with a first conductive dopant, for example, GaN, AlN, AlGaN, InGaN, InN, InAlGaN, AlInN, AlGaAs, GaP, GaAs, GaAsP, and AlGaInP. When the first conductive semiconductor layer 110 is an N-type, the first conductive dopant includes an N-type dopant such as Si, germanium (Ge), tin (Sn), selenium (Se), and tellurium (Te). The first conductive semiconductor layer 110 may be formed in a mono- or multi-layer, but is not limited thereto.

A lower portion of the first conductive semiconductor layer 110 may be defined as a first electrode contact layer and an upper portion 110A of the first conductive semiconductor layer 110 may be defined as a first conductive semiconductor layer.

The active layers 120, 122 and 124 are formed on the first conductive semiconductor layer 110, and the active layers 120, 122 and 124 may be formed in a single quantum well structure or a multiple quantum well structure. The active layers 120, 122 and 124 may be formed by the periodic structure of a well layer and a barrier layer, for example, an InGaN well layer/GaN barrier layer by using compound semiconductor material of group III-V elements.

A conductive clad layer may be formed on and/or under the active layers 120, 122 and 124, and the conductive clad layer may be formed of an AlGaN-based semiconductor.

Second conductive semiconductor layers 130, 132 and 134 are formed on the active layers 120, 122 and 124, and the second conductive semiconductor layers 130, 132 and 134 may be formed of a compound semiconductor of group III-V elements doped with a second conductive dopant, for example, GaN, AlN, AlGaN, InGaN, InN, InAlGaN, AlInN, AlGaAs, GaP, GaAs, GaAsP, and AlGaInP. When the second conductive semiconductor layers 130, 132 and 134 are a P-type, the second conductive dopant includes a P-type dopant such as magnesium (Mg) and Zn. The second conductive semiconductor layers 130, 132 and 134 may be formed in a mono- or multi-layer, but is not limited thereto.

In addition, third conductive semiconductor layers, for example, N-type semiconductor layers or P-type semiconductor layers, may be formed on the second conductive semiconductor layers 130, 132 and 134. The third conductive semiconductor layers are formed of semiconductors of a different polarity from the second conductive semiconductor layers. The light emitting cells 102, 103 and 104 may include at least one of an N-P junction structure, a P-N junction structure, an N-P-N junction structure, and a P-N-P junction structure.

Each of the light emitting cells 102, 103 and 104 may include the upper portions 110A of the first conductive semiconductor layer 110. The thickness of the upper portion 110A of the first conductive semiconductor layer 110 may be changed according to a mesa etching thickness.

The first to third light emitting cells 102, 103 and 104 have such a structure that the active layers 120, 122 and 124 and the second conductive semiconductor layers 130, 132 and 134 are separated on the first conductive semiconductor layer 110.

Transparent electrodes (not shown) may be formed on the second conductive semiconductor layers 130, 132 and 134 or the third conductive semiconductor layers. The transparent electrodes may include, but are not limited to, at least one of indium tin oxide (ITO), indium zinc oxide (IZO), gallium zinc oxide (GZO), aluminum zinc oxide (AZO), aluminum gallium zinc oxide (AGZO), indium gallium zinc oxide (IGZO), iridium oxide (IrOx), ruthenium oxide (RuOx), RuOx/ITO, Ni/IrOx/Au, and Ni/IrOx/Au/ITO.

A first electrode 115 is formed in a predetermined pattern or shape on the first conductive semiconductor layer 110. The first electrode 115 is commonly connected to the light emitting cells 102, 103 and 104.

Second electrodes 150, 152 and 154 are formed in a predetermined pattern or shape on the second conductive semiconductor layers 130, 132 and 134 of the first to third light emitting cells 102, 103 and 104. The second electrodes 150, 152 and 154 function as individual electrodes.

When the plurality of light emitting cells 102, 103 and 104 are divided into three structures, they may be defined as the first light emitting cell 102, the second light emitting cell 103, and the third light emitting cell 104.

A first phosphor layer 142 may be formed on the second light emitting cell 103, and a second phosphor layer 144 may be formed on the third light emitting cell 104. The first phosphor layer 142 is formed on the second conductive semiconductor layer 132 of the second light emitting cell 103, and the second phosphor layer 144 is formed on the second conductive semiconductor layer 134 of the third light emitting cell 104.

The process of forming the first electrode 115 and the second electrodes 150, 152 and 154 may be performed before or after a mesa etching.

The process of forming the phosphor layers 142 and 144 may be performed before the formation of the second electrodes 150, 152 and 154 or after fabrication of a chip.

The first phosphor layer 142 may be a film containing a red phosphor, or may be formed by printing or coating a phosphor containing resin. The second phosphor layer 144 may be a film containing a green phosphor, or may be formed by printing or coating a phosphor containing resin.

The first phosphor layer 142 and the second phosphor layer 144 may include a transparent resin layer thereunder, and the transparent resin layer can improve distribution of light incident onto the phosphor layers 142 and 144.

In the first to third light emitting cells 102, 103 and 104, when power is supplied to the first electrode 115 and the second electrodes 150, 152 and 154, the active layers 120, 122 and 124 emit a first color light.

The first phosphor layer 142 absorbs the first color light of the second light emitting cell 103 and emits a second color light. The second phosphor layer 144 absorbs the first color light of the third light emitting cell 104 and emits a third color light. Light finally emitted through the upper portions of the first to third light emitting cells 102, 103 and 104 is emitted as the first color light, the second color light, and the third color light.

Also, the first to third light emitting cells 102, 103 and 104 may each emit one of a red color light, a green color light, a blue color light, and an ultraviolet. The first phosphor layer 142 emits the second color light that is complementary to the first color light emitted from the first to third light emitting cells 102, 103 and 104. The second phosphor layer 144 emits the third color light that is complementary to the first color light emitted from the first to third light emitting cells 102, 103 and 104. The light emitting cells 102, 103, and 104 emit a light of a first wavelength range, and the phosphor layers 142 and 144 case to be emitted at least one of a light of second wavelength range excited by the first wavelength range. The first and second wavelength range may include a first and second wavelength range.

The phosphor layers 142 and 144 emit a light of at least one of a blue color, a red color, and a green color excited by the first wavelength range emitted from the light emitting cells 102, 103, and 104. The first wavelength is shorter than a light of second wavelength emitted from the phosphor layers 142 and/or 144.

When the second color light among the first to third light is emitted through at least one light emitting cell, it is mixed to implement a specific color. Also, when the first to third light emitting cells 102, 103 and 104 emit a blue light; the first phosphor layer 142 is a red phosphor layer; and the second phosphor layer 144 is a green phosphor layer, full color can be emitted by selective driving of the first to third light emitting cells 102, 103 and 104. Moreover, white light can be emitted by mixing the blue color light, the red color light, and the green color light.

The first phosphor layer 142 and the second phosphor layer 144 may use the same phosphor. For example, the first phosphor layer 142 and the second phosphor layer 144 may be implemented with a film or a printed layer containing a yellow phosphor.

Furthermore, a third phosphor layer may be disposed on the second conductive semiconductor layer 130 of the first light emitting cell 102. In this case, when a compound semiconductor emits an ultraviolet ray, a blue phosphor layer may be disposed on the first light emitting cell 102.

The first to third light emitting cells 102, 103 and 104 on the second conductive semiconductor layers 130, 132 and 134 may be formed in a polygonal shape.

Moreover, the first to third light emitting cells 102, 103 and 104 may have the same size or different size. For example, the light emitting cell 104 emitting the green color light may be larger in size than the light emitting cells 102 and 103 emitting other color light. The size of the light emitting cells 102, 103 and 104 may be adjusted based on information about colors emitted on the final package.

In the light emitting device 100, when power is supplied to at least one of the first electrode 115 and the second electrodes 150, 152 and 154, the first color light, the second color light, and the third color light may be selectively emitted and mixed.

Figure 3:
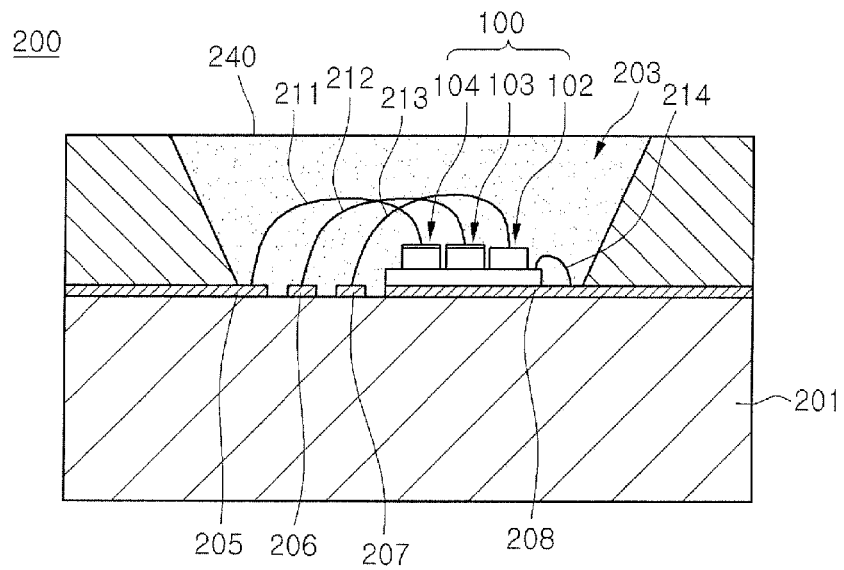
FIG. 3 is a side sectional view illustrating a package of the light emitting device of FIG. 1.

FIG. 3 is a side sectional view illustrating a package of the light emitting device of FIG. 1. In the description of FIG. 3, the same parts as the first embodiment are referred to using same reference numbers, and duplicated description will be omitted.

Referring to FIG. 3, a light emitting device package 200 includes a body 201, a plurality of lead electrodes 205, 206, 207 and 208, and a light emitting device 100.

The body 201 may use a general printed circuit board (PCB), a flame retardant 4 (FR-4), a ceramic substrate, a silicon substrate, or a resin material. A cup-shaped cavity 203 is formed on the body 201.

The surface shape of the cavity 203 may have a circular or polygonal structure, but is not limited thereto. The cavity 203 of the body 201 may be formed by etching the body 201, or may be formed in a mould structure or a stacked structure.

The light emitting device 100 includes the first to third light emitting cells 102, 103 and 104, and the second and third light emitting cells 103 and 104 include the phosphor layers 142 and 144 of FIG. 1.

The lead electrodes 205, 206, 207 and 208 include a plurality of patterns and are electrically connected to the first to third light emitting cells 102, 103 and 104. The number of the lead electrodes 205, 206 and 207 may be formed for the individual driving of the first to third light emitting cells 102, 103 and 104. For example, four lead electrodes 205, 206, 207 and 208 may be formed for three light emitting cells 102, 103 and 104. The lead electrodes 205, 206, 207 and 208 are disposed to be exposed inside the cavity 203.

The light emitting device 100 may be attached to one lead electrode 208 among the plurality of lead electrodes 205, 206, 207 and 208, and may be electrically connected to the lead electrodes 205, 206, 207 and 208 through wires 211, 212, 213 and 214. Although the structure where the light emitting device is connected to the lead electrodes 205, 206, 207 and 208 through the wires 211, 212, 213 and 214 has been described in the above-described embodiment, it may also be modified by using a flip bonding or a die bonding within the technical scope of the embodiment.

A transparent resin material (not shown) may be molded in the cavity 203. The transparent resin material may include silicon or epoxy. Also, the transparent resin material may include, but is not limited to, a phosphor or a phosphor layer.

The light emitting device package 200 may implement full color (including white color) by mounting the light emitting device 100 having the plurality of light emitting cells 102, 103 and 104. Accordingly, it is possible to eliminate the inconvenience that must arrange other LED chips for implementing the full colors.

The light emitting cells 102, 103, and 104 emit a light of a first wavelength range, the phosphor layers 142 and 144 emit a light of second wavelength range excited by the first wavelength range, and the resin material emits a light of third wavelength range excited by at least one of the first wavelength range and the second wavelength range. The light emitting cells 102, 103, and 104 emit a light of a blue color or ultraviolet. The phosphor layers 142 and 144 emit a light of at least one of a blue color, a red color, and a green color excited by light emitted from the light emitting cells 102, 103, and 104. The resin material includes a phosphor emitting a light of at least one of a blue color, a red color, and a green color excited by light emitted from the light emitting cells 102, 103, and 104. The first wavelength is shorter than a light of the second wavelength emitted the first phosphor layer 142 and/or the second phosphor layer 144, and the second wavelength is shorter than a light of the third wavelength emitted from the phosphor in the resin material.

Figure 4:
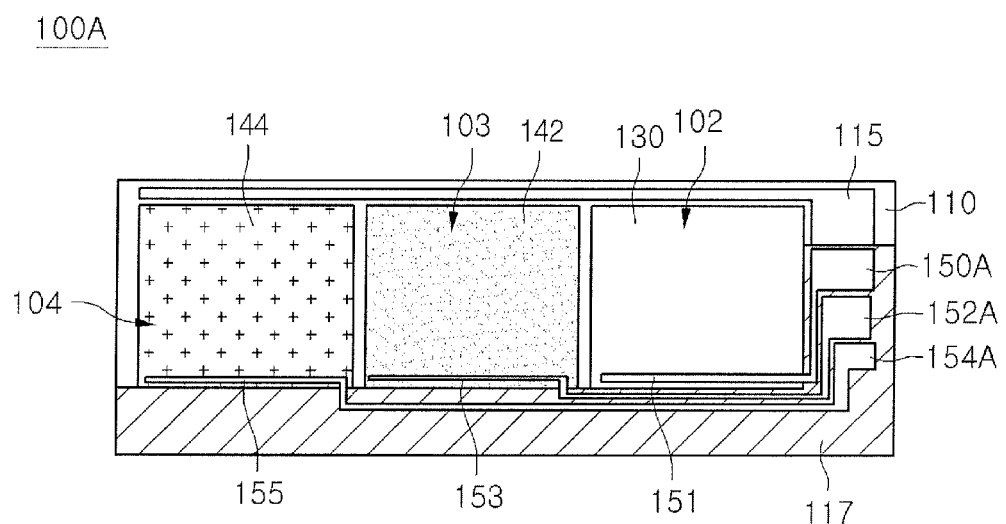
FIG. 4 is a plan view illustrating a light emitting device according to a second embodiment.

FIG. 4 is a plan view illustrating a light emitting device according to a second embodiment. In the description of the second embodiment, the same reference numerals are used to refer to the same parts as the first embodiment, and their duplicated description will be omitted.

Referring to FIG. 4, a light emitting device 100A includes a first electrode 115 and a plurality of second electrodes 150A, 152A and 154A on a first conductive semiconductor layer 110.

The plurality of second electrodes 150A, 152A and 154A have first ends 151, 153 and 155 connected to the second conductive semiconductor layers (130, 132 and 134 in FIG. 1) of the light emitting cells 102, 103 and 104, and second ends having bonding pads; and are formed on an insulation layer 117.

In this case, the insulation layer 117 is formed between a region except the first ends 151, 153 and 155 and another semiconductor layer. The insulation layer 117 may be formed between the second electrodes 150A, 152A and 154A and the first conductive semiconductor layer 110, and between the light emitting cells 102, 103 and 104 and a second electrode line.

By arranging the first electrode 115 and the second electrodes 150A, 152A and 154A on the first conductive semiconductor layer 110, it is possible to minimize impacts that may be applied to the active layers (120, 122 and 124 in FIG. 1) during the bonding, and the process of printing or coating a phosphor containing film or resin can be easily designed.

Figure 5:
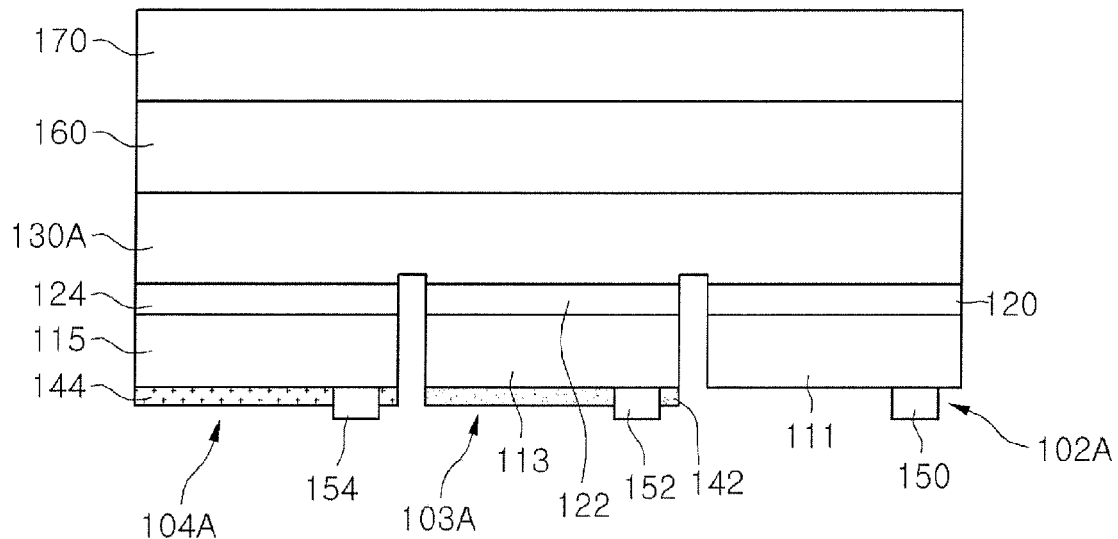
FIG. 5 is a side sectional view illustrating a light emitting device according to a third embodiment.
Figure 6:
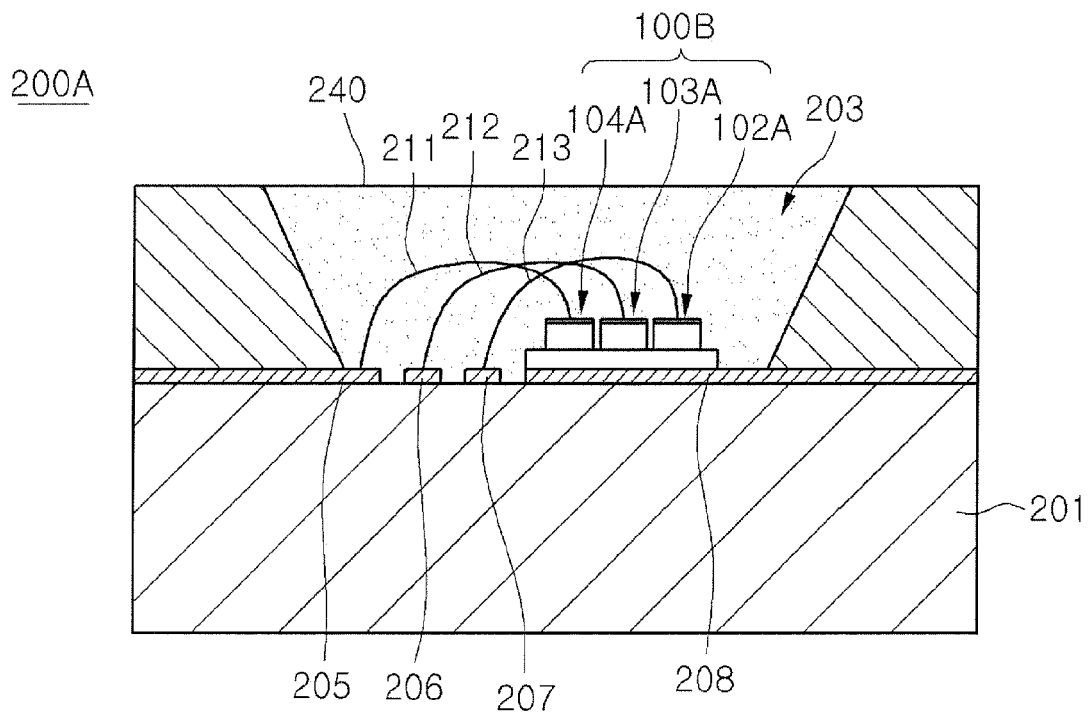
FIG. 6 is a side sectional view illustrating a package of the light emitting device of FIG. 5.

FIG. 5 is a side sectional view illustrating a light emitting device according to a third embodiment, and FIG. 6 is a side sectional view illustrating a package of the light emitting device of FIG. 5. The third embodiment relates to a vertical type light emitting device, and the same parts as the first embodiment are referred using the same reference numerals as the first embodiment, and also, duplicated description will be omitted.

Referring to FIG. 5, the light emitting device 100B includes a reflective electrode layer 160 on a second conductive semiconductor layer 130A, and a conductive support member 170 on the reflective electrode layer 160. The reflective electrode layer 160 may be formed of a material selected from the group consisting of silver (Ag), nickel (Ni), aluminum (Al), rhodium (Rh), palladium (Pd), Ir, Ru, Mg, Zn, platinum (Pt), gold (Au), hafnium (Hf), and combinations thereof. The conductive support member 170 is a base substrate and may be implemented with Cu, Au, Ni, molybdenum (Mo), or copper-tungsten (Cu—W), or a carrier wafer such as Si, Ge, GaAs, ZnO, SiC, GaN, germanium oxide ($Ge_2O_3$), silicon-germanium (SiGe). The conductive support member 170 may be formed by an electroplating method or in a sheet shape, but is not limited thereto.

An ohmic contact layer (not shown) may be formed between the reflective electrode layer 160 and the second conductive semiconductor layer 130A, and the ohmic contact layer may be formed in a layer structure or a multiple pattern structure. The ohmic contact layer may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO.

When the conductive support member 170 is formed, the substrate (101 in FIG. 1) is removed by physical and/or chemical methods. As one of the physical methods, the substrate (101 in FIG. 1) may be removed by a laser lift off (LLO) method using laser. As one of the chemical methods, the substrate may be separated by injecting a wet etchant into the semiconductor layer (for example, the buffer layer) between the substrate 101 and the first conductive semiconductor layer (110 in FIG. 1).

The plurality of light emitting cells 102A, 103A and 104A are divided by a mesa etching. In the mesa etching, the plurality of light emitting cells 102A, 103A and 104A are formed at a predetermined depth at which a portion of the second conductive semiconductor layer 130A is exposed from the first conductive semiconductor layer (110 in FIG. 1). Accordingly, the active layers 120, 122 and 124 and the first conductive semiconductor layers 111, 113 and 115 are divided under the second conductive semiconductor layer 130A to operate as the plurality of light emitting cells 102A, 103A and 104A.

First electrodes 150, 152 and 154 having predetermined patterns may be formed under the first conductive semiconductor layers 111, 113 and 115 of the light emitting cells 102A, 103A and 104A.

A first phosphor layer 142 is formed under the first conductive semiconductor layer 113 of the second light emitting cell 103A, and a second phosphor layer 144 is formed under the first conductive semiconductor layer 115 of the third light emitting cell 104A.

The output light of the light emitting device 100B may be emitted as at least the second color light among the first to third color light through the light emitting cells 102A, 103A and 104A, and the emitted second color light may be mixed and emitted as a desired color light.

Figure 7:
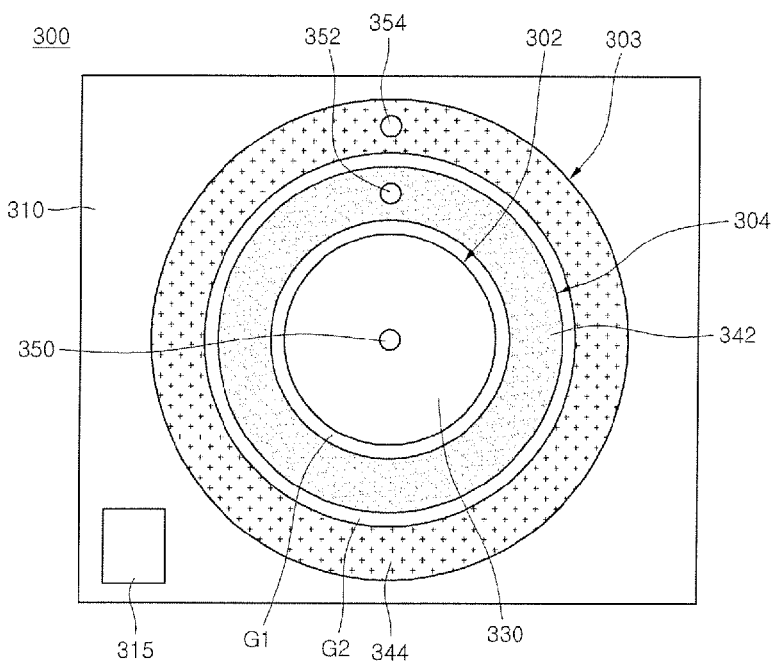
FIG. 7 is a plan view of a light emitting device according to a fourth embodiment.

FIG. 7 is a plan view illustrating a light emitting device according to a fourth embodiment. In the description of the fourth embodiment, the same parts as the first embodiment are referred to the description of the first embodiment, and duplicated description will be omitted.

Referring to FIG. 7, the light emitting device 300 includes a plurality of light emitting cells 302, 303 and 304 in a dual structure.

The first light emitting cell 302 may be formed at the center in a circular shape, and the second light emitting cell 303 may be formed at an outer periphery of the first light emitting cell 302 in a ring shape. The third light emitting cell 304 may be formed at an outer periphery of the second light emitting cell 303 in a ring shape. The first to third light emitting cells 302, 303 and 304 may be spaced apart by predetermined gaps G1 and G2.

The second electrodes 350, 352 and 354 are formed on the first to third light emitting cells 302, 303 and 304, and the first electrode 315 is formed on the first conductive semiconductor layer 310. The pattern of the first electrode 315 may be formed in an open loop type or a closed loop type (for example, a ring shape) around the first to third light emitting cells 302, 303 and 304. The shape of the pattern may be changed so that the current is smoothly supplied.

The first phosphor layer 342 is formed on the second light emitting cell 303, and the second phosphor layer 344 is formed on the second light emitting cell 304. The light emitting cells 302, 303 and 304 and the phosphor layers 342 and 344 are the same as those of the first embodiment, and their detailed description will be omitted.

In the light emitting device 300, the upper structure is formed in a cylindrical shape, and at least the second color light or the third color light is emitted, thereby implementing the full colors. In addition, the light emitting device 300 can improve the light emission area through the cylindrical shape. When packaging the light emitting device 300 on the circular cavity, the light efficiency can be improved.

Figure 8:
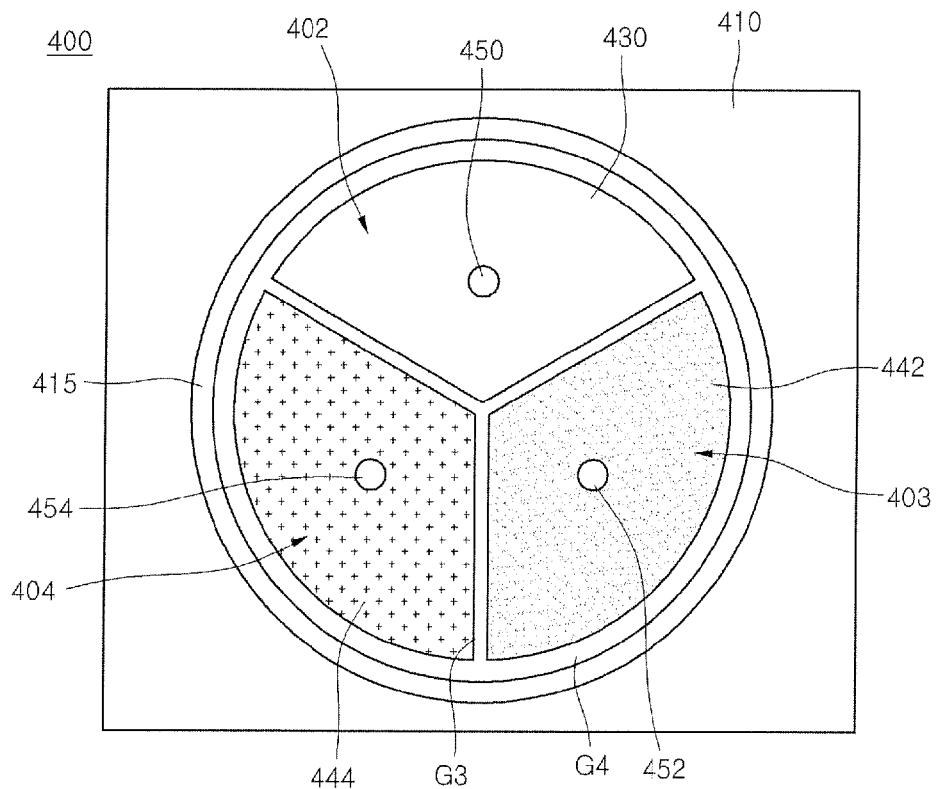
FIG. 8 is a plan view of a light emitting device according to a fifth embodiment.

FIG. 8 is a plan view illustrating a light emitting device according to a fifth embodiment. In the description of FIG. 8, the same parts as the first embodiment are referred to the description of the first embodiment, and duplicated description will be omitted.

Referring to FIG. 8, the light emitting device 400 includes a plurality of fan-shaped light emitting cells 402, 403 and 404 within a circle having a predetermined diameter from the center.

A first electrode 415 is arranged around the light emitting cells 402, 403 and 404 in a closed loop type (for example, a ring shape) and spaced apart from the light emitting cells 402, 403 and 404 by a predetermined gap G4. The first electrode 415 is disposed on the first conductive semiconductor layer 410. A gap G3 is formed between the light emitting cells 402, 403 and 404 for their separation.

A first phosphor layer 442 is formed on the second light emitting cell 403, and a second phosphor layer 444 is formed on the third light emitting cell 404. The light emitting cells 402, 403 and 404 and the phosphor layers 442 and 444 are the same as those of the first embodiment, and their detailed description will be omitted.

In the light emitting device 400, the upper structure is formed in a cylindrical shape or a prism shape, and at least the second color light or the third color light is emitted, thereby implementing the full colors. In addition, the light emitting device 400 can improve the light emission area through the cylindrical shape or a prism shape. When packaging the light emitting device 400 on a circular cavity, the light efficiency can be improved. The light emitting cells 402, 403 and 404 emit a light of a first wavelength range, and at least one of the phosphor layers 442, 444 emits a light of second wavelength range excited by the first wavelength range. The wavelength range may include a peak wavelength.

In the description of the embodiments, the technical features of the embodiments can be optionally applied to other embodiments, but the present invention is not limited to them.

In embodiments, the full colors can be implemented in a single chip.

In embodiments, it is possible to eliminate the inconvenience that must combine a plurality of LED chips for desired colors.

In the embodiments, the reliability of the light emitting device can be improved.

In the embodiments, the LED capable of implementing the full colors can be provided.

In the embodiments, the electrical reliability of the light emitting device can be improved.

In the embodiments, the current efficiency and light efficiency of the light emitting device can be improved.

In the embodiments, the light source packaged with the light emitting device can be applied to lighting fields, indicator fields, display fields, and so on.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a first conductive semiconductor layer;
a plurality of light emitting cells disposed on the first conductive semiconductor layer, wherein the light emitting cells each comprise an active layer on a top surface of the first conductive semiconductor layer and a second conductive semiconductor layer on the active layer, wherein, in each light emitting cell, a width of a top surface of the second conductive semiconductor layer is equal to a width of a top surface of the active layer;
a phosphor layer on at least one of the light emitting cells;
a plurality of second electrodes, wherein each second electrode is electrically connected to the second conductive semiconductor layer of a light emitting cell of the plurality of light emitting cells; and
an insulating layer including a first region disposed on an upper surface of the first conductive semiconductor layer and a second region disposed around the light emitting cells;
wherein each of the second electrodes includes a first portion and a second portion extended from the first portion,
wherein the first portion of each of the second electrodes is disposed on the second conductive semiconductor layer of each of the light emitting cells, and
wherein the second portion of each of the plurality of second electrodes is contacted with the second region of the insulating layer.

2. The light emitting device according to claim 1, wherein the plurality of light emitting cells comprises a first light emitting cell, a second light emitting cell, and a third light emitting cell, wherein the first, second, and third light emitting cells comprise a plurality of compound semiconductor layers using group III-V elements and are spaced apart from one another.

3. The light emitting device according to claim 2, wherein at least one of the first, second and third light emitting cells has at least one of a circular shape, a polygonal shape, a prism shape, a ring shape, and a fan shape.

4. The light emitting device according to claim 2, wherein the first, second, and third light emitting cells each comprise at least one of an N-P junction structure, a P-N junction structure, an N-P junction structure, a P-N-P junction structure, and an N-P-N junction structure.

5. The light emitting device according to claim 2, wherein the first, second, and third light emitting cells comprise a plurality of upper portions of the first conductive semiconductor layer,
wherein the plurality of upper portions are separated on the first conductive semiconductor layer and are formed under the active layer.

6. The light emitting device according to claim 2, wherein the first, second, and third light emitting cells emit at least one of an ultraviolet ray, a blue color light, a red color light, and a green color light.

7. The light emitting device according to claim 2, wherein the phosphor layer comprises:
a first phosphor layer on the second light emitting cell; and
a second phosphor layer on the third light emitting cell,
wherein the first and second phosphor layers are spaced apart from each other by a first gap, and
wherein the plurality of light emitting cells has a second gap equal to the first gap.

8. The light emitting device according to claim 7, wherein the first, second, and third light emitting cells emit a blue color light;
wherein the first phosphor layer is a red phosphor layer; and
wherein the second phosphor layer is a green phosphor layer.

9. The light emitting device according to claim 1, further comprising a first electrode disposed on the upper surface of the first conductive semiconductor layer and having a horizontal length longer than a sum of horizontal lengths of the plurality of light emitting cells.

10. The light emitting device according to claim 9, wherein the first electrode is formed in an open loop type or a closed loop type along outer sides of the plurality of light emitting cells.

11. The light emitting device according to claim 9, wherein the first electrode and the second portion of each of the plurality of second electrodes are disposed on the upper surface of the first conductive semiconductor layer.

12. The light emitting device according to claim 1, wherein the phosphor layer comprises a fluorescent film, a printed phosphor layer, or a transparent resin layer containing a phosphor.

13. The light emitting device according to claim 1, further comprising a substrate disposed under the first conductive semiconductor layer, wherein an area of a bottom surface of the first conductive semiconductor layer is equal to an area of a top surface of the substrate.

14. The light emitting device according to claim 1, wherein the first conductive semiconductor layer includes an n-type dopant and the second conductive semiconductor layer includes a p-type dopant.

15. A light emitting device package, comprising:
a package body;
a plurality of electrodes on the package body;
a light emitting device comprising a plurality of light emitting cells connected to the plurality of electrodes and a phosphor layer on at least one of the light emitting cells, wherein a width of a top surface of the phosphor layer is equal to a width of a top surface of said at least one of the light emitting cells; and
a resin material covering the light emitting device;
wherein the plurality of light emitting cells is disposed on a first conductive semiconductor layer;
wherein the light emitting cells each comprise an active layer on a top surface of the first conductive semiconductor layer and a second conductive semiconductor layer on the active layer,
wherein the light emitting device comprises:
a plurality of second electrodes, wherein each second electrode is electrically connected to the second conductive semiconductor layer of a light emitting cell of the plurality of light emitting cells;
a first electrode electrically connected to the first conductive semiconductor layer; and
an insulating layer including a first region disposed on an upper surface of the first conductive semiconductor layer and a second region disposed around the light emitting cells;
wherein the active layer is disposed between the first and second conductive semiconductor layers,
wherein the plurality of light emitting cells are spaced apart from each other and are further protruded than the upper surface of the first conductive semiconductor layer is,
wherein each of the second electrodes includes a first portion and a second portion extended from the first portion,
wherein the first portion of each of the second electrodes is disposed on a top surface of the second conductive semiconductor layer of each of the light emitting cells, and
wherein the second region of the insulating layer is disposed between the second portion of each of the second electrodes and the upper surface of the first conductive semiconductor layer.

16. The light emitting device package according to claim 15, wherein the light emitting cells emit a light of blue color or ultraviolet.

17. The light emitting device package according to claim 15, wherein the phosphor layer emits a light of at least one of a blue color, a red color, and a green color excited by light emitted from the light emitting cells.

18. The light emitting device package according to claim 15, wherein the resin material includes a phosphor emitting light of at least one of a blue color, a red color, and a green color excited by light emitted from the light emitting cells.

* * * * *